US008779535B2

(12) United States Patent
Goida et al.

(10) Patent No.: US 8,779,535 B2
(45) Date of Patent: Jul. 15, 2014

(54) PACKAGED INTEGRATED DEVICE DIE BETWEEN AN EXTERNAL AND INTERNAL HOUSING

(75) Inventors: Thomas M. Goida, Windham, NH (US); Jicheng Yang, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 177 days.

(21) Appl. No.: 13/420,354

(22) Filed: Mar. 14, 2012

(65) Prior Publication Data
US 2013/0241045 A1  Sep. 19, 2013

(51) Int. Cl.
| H01L 29/84 | (2006.01) |
| H04R 25/00 | (2006.01) |
| H01L 21/00 | (2006.01) |
| H04R 19/04 | (2006.01) |
| H01L 23/10 | (2006.01) |
| H01L 23/12 | (2006.01) |
| H01L 21/52 | (2006.01) |

(52) U.S. Cl.
CPC ............... *H04R 19/04* (2013.01); *H01L 23/10* (2013.01); *H01L 23/12* (2013.01); *H01L 21/52* (2013.01); *H01L 2924/1433* (2013.01)
USPC .... 257/416; 257/680; 257/704; 257/E23.002; 257/E23.114; 257/E23.194; 257/E29.324; 257/E21.52; 381/174; 381/369; 438/51

(58) Field of Classification Search
CPC ......... H01L 23/10; H01L 23/12; H01L 21/52; H01L 2924/1433; H04R 19/04
USPC ............. 381/174, 369; 438/51; 257/416, 680, 257/704
See application file for complete search history.

(56) References Cited

U.S. PATENT DOCUMENTS

| 5,870,482 | A | 2/1999 | Loeppert et al. |
| 6,781,231 | B2 | 8/2004 | Minervini |
| 7,224,056 | B2 * | 5/2007 | Burtzlaff et al. ............... 257/704 |
| 7,242,089 | B2 | 7/2007 | Minervini |
| 8,199,939 | B2 | 6/2012 | Suvanto et al. |

(Continued)

FOREIGN PATENT DOCUMENTS

| JP | 2011-120097 | 6/2011 |
| KR | 10-2008-0039417 | 5/2008 |

(Continued)

OTHER PUBLICATIONS

International Search Report and Written Opinion of the International Searching Authority in counterpart International Appl. No. PCT/US2013/029382, dated Jun. 27, 2013, in 12 pages.

*Primary Examiner* — Alonzo Chambliss
(74) *Attorney, Agent, or Firm* — Knobbe, Martens, Olson & Bear LLP

(57) ABSTRACT

Integrated devices and methods for packaging the same can include an external housing, an internal housing positioned within the external housing, and an external cavity formed between the external housing and the internal housing. An integrated device die can be positioned within the external cavity in fluid communication with an internal cavity formed by the internal lid. An air way can extend through the external cavity to the internal cavity, and can further extend from the internal cavity to the external cavity. The air way can provide fluid communication between the package exterior and the integrated device die, while reducing contamination of the integrated device die.

30 Claims, 7 Drawing Sheets

(56) References Cited

U.S. PATENT DOCUMENTS

| | | |
|---|---|---|
| 2007/0071268 A1 | 3/2007 | Harney et al. |
| 2007/0202627 A1 | 8/2007 | Minervini |
| 2007/0278601 A1 | 12/2007 | Goodelle et al. |
| 2008/0175425 A1 | 7/2008 | Roberts et al. |
| 2008/0217766 A1 | 9/2008 | Minervini |
| 2008/0304681 A1 | 12/2008 | Langlois et al. |
| 2009/0202089 A1 | 8/2009 | Zhang et al. |
| 2010/0080405 A1 | 4/2010 | Wu et al. |
| 2010/0086146 A1 | 4/2010 | Gong et al. |
| 2010/0142744 A1 | 6/2010 | Rombach et al. |
| 2011/0198714 A1 | 8/2011 | Yang |
| 2011/0233692 A1 * | 9/2011 | Inoda et al. ............ 257/416 |

FOREIGN PATENT DOCUMENTS

| | | |
|---|---|---|
| WO | WO 2007/129787 | 11/2007 |
| WO | WO 2010-116324 | 10/2010 |
| WO | WO 2011/103720 A1 | 9/2011 |

* cited by examiner

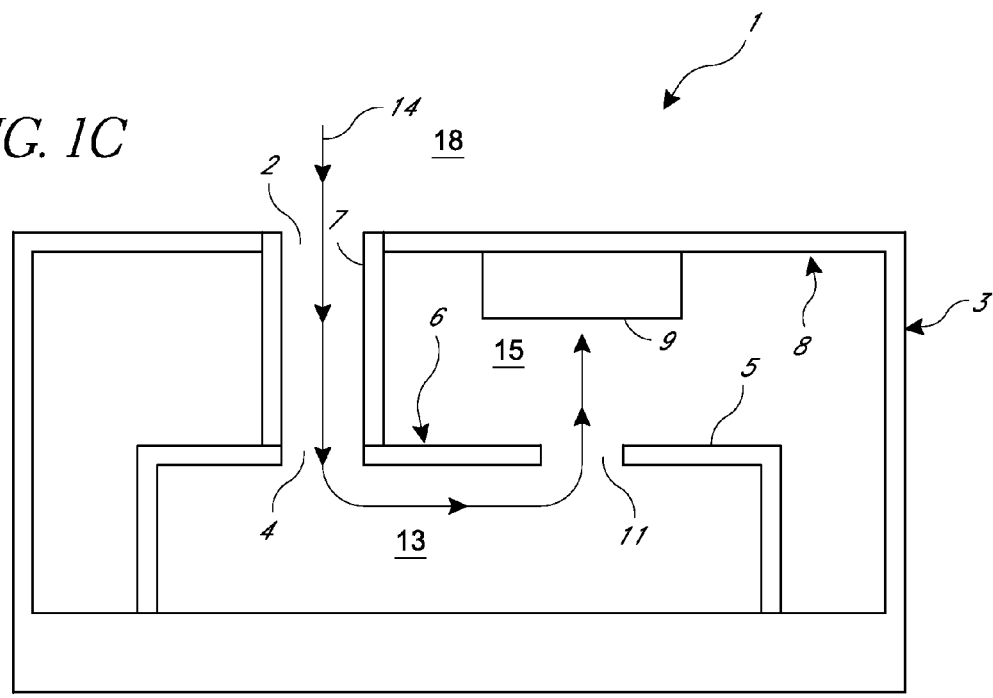
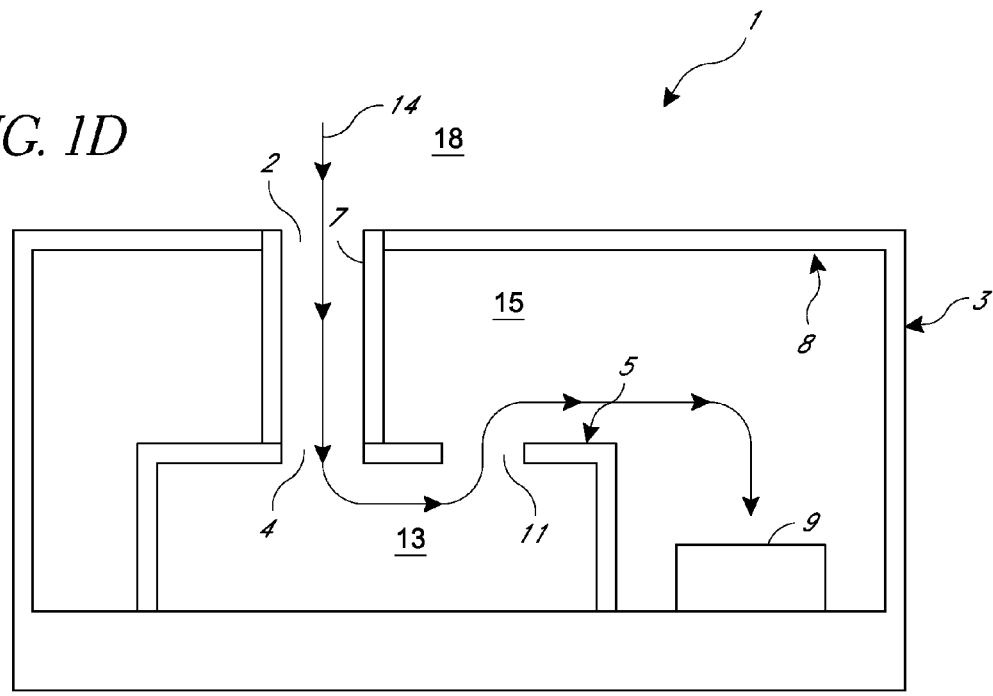

PACKAGED INTEGRATED DEVICE DIE BETWEEN AN EXTERNAL AND INTERNAL HOUSING

BACKGROUND OF THE INVENTION

1. Field of the Invention

The field relates to integrated devices and methods for packaging the same. More particularly, the field relates to packaging with air ports for devices that communicate with the surrounding environment, such as microelectromechanical systems (MEMS) microphones and pressure sensors.

2. Description of the Related Technology

Integrated device dies, such as microphone dies, are often secured within a package for environmental protection, to provide acoustic back volume and to aid in connecting the die to a larger circuit. In microphone packages, the package can include a package lid mounted to a package substrate, and an aperture can be formed through some portion of the package to allow audio signals to reach the microphone. Gas and pressure sensors can similarly include air ports in the device packaging.

It can be important to package such devices in a manner that reduces the risk of contamination. For example, if debris enters the aperture, the debris may interfere with the performance of the device, such as by contamination of sensitive MEMS membranes. There is therefore a need for improved packaging of devices with air ports (or fluid ports generally), including packages that reduce the amount of debris entering the package.

SUMMARY

In one embodiment, a packaged integrated device is disclosed. The packaged integrated device can comprise an external housing and an internal housing positioned within the external housing and defining an internal cavity. An external cavity can be defined between the external housing and the internal housing. The packaged integrated device can further comprise an integrated device die positioned within the external cavity in fluid communication with the internal cavity, and an air channel formed between the outside of the packaged integrated device and the internal cavity.

In another embodiment, a packaged integrated microphone device is disclosed. The packaged integrated microphone device can comprise a package housing having a first through hole, and an internal lid mounted to an interior surface of the package housing to define an internal cavity. The internal lid can have a second through hole and a sound port. The packaged integrated microphone device can further comprise a channel extending through the package housing to the internal cavity and between the first through hole and the second through hole. In some embodiments, a microphone die is mounted inside the package housing, wherein the microphone die includes a movable membrane. The movable membrane can be positioned to receive sound passing from outside the package housing through the channel, into the internal cavity, and through the sound port.

In another embodiment, a method for packaging an integrated device is disclosed. The method can comprise providing an internal housing having a first opening. The internal housing can define an internal cavity. The method can further include providing an external housing having a second opening. The method can also comprise positioning an integrated device die on the internal housing or on a portion of the external housing. In some embodiments, the method can comprise mechanically coupling the external housing to the internal housing such that the first and second openings form a channel between the outside of the external housing and the internal cavity.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These aspects and others will be apparent from the following description of preferred embodiments and the accompanying drawing, which is meant to illustrate and not to limit the invention, wherein:

FIGS. 1C-1D are schematic cross-sectional views of packaged integrated device dies similar to that of FIG. 1A but with different mounting locations for the device die within the package, in accordance with additional embodiments.

DETAILED DESCRIPTION

Integrated devices, such as integrated circuits, microelectromechanical systems (MEMS) devices, optical devices, other electrical/electronic devices, and mechanical devices, can often be manufactured and/or operated in environments that introduce contaminants into the integrated device. In some applications, contamination of the integrated device die can be undesirable, particularly when the contamination degrades device performance and/or reliability. For example, as discussed in more detail with respect to certain embodiments disclosed herein, integrated device dies, such as microphone device dies (including, e.g., MEMS microphone dies), can include an aperture in the integrated device package to provide a predefined air way from the package exterior to the package interior (e.g., for allowing audio signals to reach the microphone device die.) Other fluid sensors, such as gas and pressure sensor packages, can similarly include an aperture or fluid/air port. Because the aperture and air way can be in fluid communication with the external environment, debris can enter the air way during manufacturing, device processing, or operation by an end user/customer of the integrated device. Integrated device die packages can be designed in various ways to reduce contamination of the integrated device, but there remains a need to further reduce or eliminate environmental or other types of contamination or debris within integrated devices and integrated device packages.

Figure 1A:
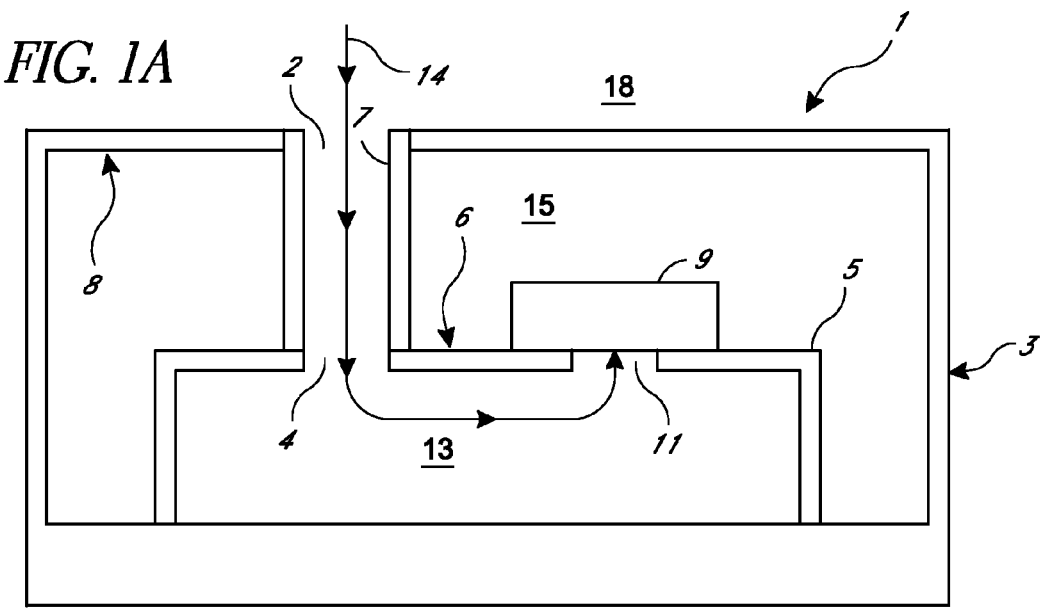
FIG. 1A is a schematic cross-sectional view of a packaged integrated device die according to one embodiment.
Figure 1B:
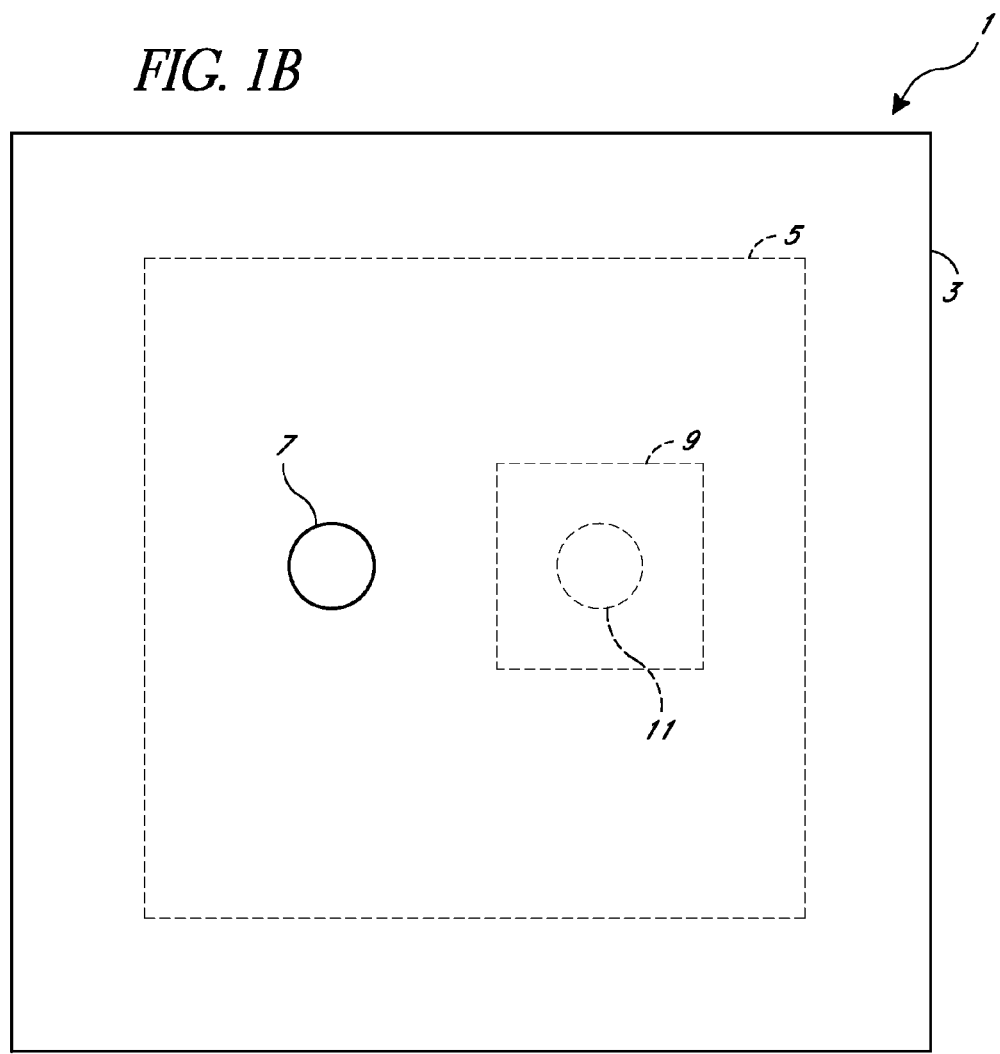
FIG. 1B is a schematic top plan view of the packaged integrated device die of FIG. 1A.

FIG. 1A is a schematic side cross-sectional view of one embodiment of a packaged integrated device 1, while FIG. 1B is a top view of the embodiment illustrated in FIG. 1A. The illustrated packaged integrated device 1 includes an external housing 3 and an internal housing 5 positioned within the external housing 3. The internal housing 5 can be shaped three-dimensionally to define an internal cavity 13 within the internal housing 5. The internal cavity 13 can be an air cavity in some embodiments (e.g., for microphone device packages). In some embodiments, the external housing 3 can include a bottom surface and a top surface, and walls substantially enclosing the housing. For example, the external housing 3 can include a package substrate and a three-dimensionally shaped lid mechanically coupled to a top surface of the package substrate. In yet other embodiments, the external housing 3 can include a package substrate, integrated or separate package walls, and a planar lid mechanically coupled to the package walls. For example, in some embodiments, the package substrate and walls can be formed of printed circuit board (PCB) or ceramic material. Skilled artisans would understand that other ways of forming the housing are possible. The internal housing 5 can generally be formed in any way that the external housing 3 can be formed. Example implementations of external and internal housings 3, 5 are discussed in more detail below.

As shown in the embodiment illustrated in FIG. 1A, an external cavity 15 is formed between the external housing 3 and the internal housing 5. In some embodiments, the external cavity 15 can be an air cavity. Air cavities can be useful in devices like microphones or pressure sensors, e.g., in devices that operate in some aspects by being in fluid communication with the surrounding environs 18 outside the packaged integrated device 1. In other embodiments, the external cavity 15 can be filled with any desirable material or gas. In the embodiment illustrated in FIGS. 1A-1B, the external cavity 15 is formed between the outer surface of the internal housing 5 and the inner surface of the external housing 3. As in FIG. 1A, the external cavity 15 can be formed as an annular cavity surrounding the internal housing 5, or in other arrangements the internal housing 5 can abut or share sidewall surfaces of the external housing 3.

An integrated device die 9 can be positioned within the external cavity 15. As shown in FIG. 1A, the integrated device die 9 can be mounted on an outer surface 6 of the internal housing 5, e.g., on a top surface of the internal housing 5. The integrated device die 9 can be used to support any of a number of different integrated devices. For example, non-limiting examples of integrated device dies 9 can include a MEMS device die, an integrated circuit die, a microphone device die (MEMS or non-MEMS), or other types of electrical/electronic device dies. In some embodiments, MEMS device dies can include MEMS microphone device dies, pressure sensors, vibration sensors, and other types of MEMS devices that can benefit from enlarged back volume. In general, the package can enclose devices that employ fluid communication with the environs 18 outside the package and that may be sensitive to contamination. Furthermore, more than one device die can be positioned within the external cavity 15, such as, e.g., an integrated circuit die like an Application-Specific Integrated Circuit (ASIC) die. In still other embodiments, the integrated device die 9 can be positioned within the internal cavity 13.

In various embodiments, an air way 14 can extend through the external cavity 15 to the internal cavity 13. The air way 14 can comprise a channel 7, which can be formed between the package exterior 18 and the internal cavity 13. The channel 7 can allow air to pass from the package exterior 18 to the internal cavity 13, or vice versa. For example, in some implementations, such as in microphone dies described in more detail below, the integrated device die 9 can be configured to utilize air (or other gases/chemicals) from outside the packaged integrated device 1, such as for sensing sound, pressure, vibrations, temperature, chemical analysis, etc. Skilled artisans will understand that other properties can be measured using air (and possibly other fluids and airborne gases or contaminants) flowing into the packaged integrated device 1 from the environs 18 outside the package 1. The channel 7 can comprise any structure that is configured to guide air or to provide a pathway through which air (or fluids generally) can pass. In the illustrated embodiment, the channel 7 is sealed against direct communication with the external cavity 15. In other arrangements, the channel 7 can comprise holes or apertures to allow limited communication between the external housing 3 and the internal housing 5, e.g., to equalize pressure without leakage of acoustic waves.

In some embodiments, the channel 7 can comprise a tube that is positioned between the external housing 3 and the internal housing 5. For instance, the top end of the tube can be press fit (or interference fit, friction fit, etc.) within a first aperture 2 in the external housing 3. The bottom end of the tube can be mechanically coupled to the outer (e.g., top) surface of the internal housing 5. As shown in FIG. 1A, the tube can be positioned on the internal housing 5 such that it aligns the first aperture 2 and a second aperture 4 formed through the internal housing 5. The air way 14 can thus pass through the first aperture 2, the tube, and the second aperture 4 into the internal cavity 13. In some embodiments, the bottom end of the tube can rest on the outer surface 6 of the internal housing 5. An adhesive can be used to assist in mechanically coupling the channel 7 to the internal housing 5. Moreover, a sealing material can be used in some arrangements to substantially seal the air way from the external cavity 15. In some cases, the sealing material can also function as an adhesive to assist in coupling the tube defining the channel 7 to the internal housing 5. In other embodiments, the tube can be integrally formed with either the external housing 3 or the internal housing 5. For example, if the tube is integrally formed with the external housing 3, then the channel 7 (e.g., tube) can be positioned on the outer surface 6 of the inner housing 5 when the internal housing 5 is positioned within the external housing 3. The channel 7 (e.g., tube) can thus provide fluid communication along the air way 14 between the environs 18 outside the package and the internal cavity 13.

The air way 14 can further extend between the second aperture 4 in the internal housing 5 and the integrated device die 9 in the external cavity 15. The air way 14 can also comprise a port hole 11 (e.g., a sound port in some implementations, as discussed below) formed through the internal housing 5. The port hole 11 can provide fluid communication between the internal cavity 13 and the external cavity 15. In some embodiments, the integrated device die 9 positioned within the external cavity 15 can therefore fluidly communicate with the internal cavity 13 by way of the port hole 11. For example, as discussed below, microphone device dies can receive sound signals through the port hole 11 (e.g., a sound port). In turn, the channel 7 can provide fluid communication between the internal cavity 13 and the outside environs 18. The air way 14 can therefore extend from the outside environs 18, through the channel 7 and the internal cavity 13, and into the external cavity 15. Consequently, the integrated device die 9 can maintain fluid communication (e.g., can receive sound signals) with the outside environs 18 by way of the channel 7, the internal cavity 13, and the port hole 11.

The embodiments illustrated in FIGS. 1A-1B can be advantageous for several reasons. As mentioned above, it can be undesirable for debris to contaminate the integrated device die 9. For example, in embodiments where the air way 14 separating the outside environs 18 from the integrated device die 9 is relatively short, debris can easily traverse the air way 14 and contaminate the integrated device die 9. For instance, in the absence of the channel 7 and the second aperture 4, debris could easily pass from the outside environs 18 through the first aperture 2 and contaminate the integrated device die 9.

By contrast, in FIG. 1A, the air way 14 separating the die 9 from the outside environs 18 passes through the channel 7, winds through the internal cavity 13, and then turns into the port hole 11 to fluidly communicate with the integrated device die 9. Debris that enters the first aperture 2 can accumulate along the walls of the channel 7 as it passes along the air way 14. Debris traveling along the air way 14 can also accumulate or be trapped within the internal cavity 13 or along the inner surfaces of the internal housing 5. In addition, in other embodiments, additional debris capturing structures can be provided within the package housing, e.g., within the internal cavity 13 to further enhance the capture of debris. For example, while FIG. 1A shows a relatively simple air way that winds through the channel 7, into the internal cavity 13 and through the port hole 11, the packaged integrated device 1 can include additional labyrinthine channels or bends in the path that connects the first aperture 2 of the external housing 3 with the port hole 11. In addition, filters may be placed within one or more of the apertures 2, 4 and port hole 11 to capture unwanted debris in some embodiments. Increasing the surface area of the channels along the air way 14 can increase the likelihood that debris will accumulate on those surfaces. By lengthening the air way 14 and by introducing bends and curves into the fluid pathway, debris can thereby be even more effectively captured or prevented from entering the external cavity 15 to contaminate the die 9. In addition, in some implementations, the longer air way 14 can improve the acoustics of microphone devices by providing for an improved sound pathway. Surfaces and path lengths defining the channel 7 and internal cavity 13, for example, can be selected to improve acoustic performance.

FIG. 1C illustrates a packaged integrated device 1 that is similar in some respects to the embodiments illustrated in FIGS. 1A-1B above and like reference numerals are employed to refer to similar parts. While the integrated device die 9 of FIG. 1A is positioned on the outer surface 6 of the internal housing 5, the integrated device die 9 of FIG. 1C is instead positioned on an inner surface 8 of the external housing 3. In FIG. 1C, the integrated device die 9 is positioned on an upper portion of the inner surface 8 of the external housing 3. For example, in implementations utilizing a package lid (discussed below), the integrated device die 9 can be attached to an interior surface of the package lid with electrical routing to external leads. Although the integrated device die 9 of FIG. 1C is positioned on a different surface from the integrated device die 9 of FIG. 1A, both integrated device dies 9 are positioned within the external cavity 15. Thus, in both the embodiments of FIGS. 1A and 1C, the integrated device die 9 can maintain fluid communication with the outside environs 18 by way of the air way 14. In FIG. 1C, the air way 14 connecting the integrated device die 9 with the outside environs 18 is slightly longer than in FIG. 1A, because the integrated device die is positioned on the upper portion of the inner surface 8 of the external housing 3, rather than directly over the port hole 11 formed within the internal housing 5. The lengthened air way may further reduce contamination caused by debris entering the packaged integrated device 1 from the outside environs 18. FIG. 1A, on the other hand, has the advantage of providing a large back volume for a MEMS device.

Similarly, FIG. 1D illustrates another embodiment, wherein the integrated device die 9 is positioned on a lower portion of the inner surface 8 of the external housing 3. In embodiments that use a package substrate and lid, for example, the integrated device die 9 can be positioned on a top surface of the package substrate with electrical routing to external leads. Embodiments using a package substrate implementation will be discussed in more detail below. As shown in FIG. 1D, the air way 14 connecting the outside environs 18 to the integrated device die 9 is longer and has more bends than the embodiments illustrated in FIGS. 1A and 1C. For instance, in FIG. 1D, the air way 14 passes through the channel 7, winds through the internal cavity 13, enters the external cavity 15 through the port hole 11, and curves through the external cavity 15 to fluidly communicate with the integrated device die 9. As described above, this long, curved air pathway can be advantageous in preventing debris from reaching (and contaminating) the integrated device die 9. Traditional substrate materials, such as PCB or molded leadframes, can provide external leads for connecting to the integrated device die 9.

Figure 2A:
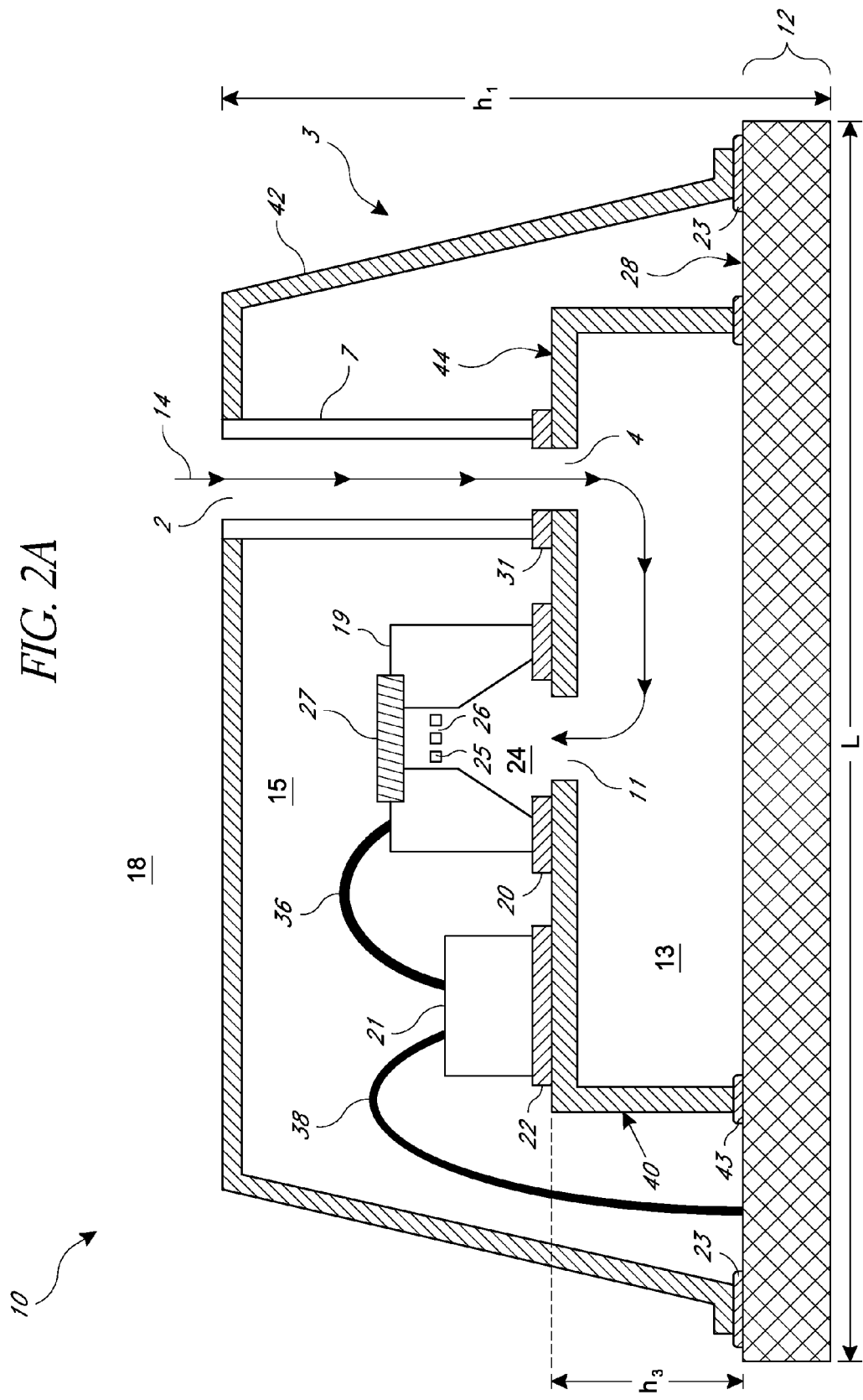
FIG. 2A is a schematic cross-sectional view of a packaged MEMS microphone device having an external lid and a three-dimensionally shaped internal lid in accordance with one embodiment.

Turning to FIG. 2A, a packaged integrated microphone device 10 is disclosed. The packaged integrated microphone device 10 comprises an external package lid 42 and a package substrate 12, collectively referred to as the external housing 3 (or the "package housing"). The external package lid 42 includes a first aperture 2, which can be circular, quadrilateral, or any other suitable shape. The packaged integrated microphone device 10 further comprises a microphone die 19, an integrated circuit die 21, and an internal lid 40. The microphone die 19 illustrated in FIG. 1 is a MEMS microphone die, although in other embodiments, the microphone die 19 can be any other suitable microphone device, such as an electret condenser microphone (ECM).

The package substrate 12 can be configured to electrically connect the packaged integrated microphone device 10 to a printed circuit board or other larger electrical apparatus or system. The package substrate 12 can include, for example, one or more contacts and/or power or ground leads (not shown in FIG. 2A). For example, the package substrate 12 can include a ground lead for serving as a reference voltage to ground the external package lid 42. The package substrate 12 can be formed from a variety of materials, including, for example, a ceramic package material or a printed circuit board (PCB) material (e.g., a pre-impregnated composite fiber (prepreg), such as FR-4 board, and a metal, such as copper), or pre-molded plastic with leadframes. In various embodiments, the width and length (L) of the integrated microphone device package 10 can be defined by the dimensions of the package substrate 12 used in the package. In some embodiments, the integrated microphone device package 10 can be a rectangular (or quadrilateral) shape having dimensions between about 1 mm and 6 mm per side. In one embodiment, the dimensions of the integrated microphone device package 10 can be about 4.7 mm on one side (e.g., L as in FIG. 2A) and about 3.7 mm on the other. In still other embodiments, the dimensions of the integrated microphone device package 10 can be larger or smaller depending on the desired implementation.

For applications in which it is desirable for the external package lid 42 to provide radio frequency (RF) shielding and/or to transmit electrical signals, the external package lid 42 can be formed of metal, or can be formed of ceramic or plastic with a conductive layer or mesh. For example, the external lid 42 can be formed of copper, stainless steel, nickel, aluminum, gold, or from alloys (such as a copper-nickel alloy). Skilled artisans will recognize that other materials for the lid are possible. As illustrated in FIG. 2A, the external lid 42 can be three-dimensionally shaped to have a concavity that forms the boundary of the interior of the package.

The illustrated packaged integrated microphone device 10 also includes an external lid adhesive 23 for bonding the external package lid 42 to a top or interior surface 28 of the package substrate 12. The external lid adhesive 23 can be, for example, solder or an epoxy. The external lid adhesive 23 can be conductive and can be configured to electrically connect the external package lid 42 to traces (e.g., grounded) on the package substrate 12, thereby aiding in mitigating the potential impact of electromagnetic interference and/or reducing static charge build-up in the external package lid 42. As shown in FIG. 2A, the packaged integrated microphone device 10 can have a height, $h_1$, e.g., the distance between a bottom surface of the package substrate 12 and a top (or exterior) surface of the external lid 42. In various embodiments, $h_1$ can be in a range between about 0.5 mm to about 1.5 mm. In some embodiments, $h_1$ can be about 1.1 mm. In one embodiment, the height $h_1$ can be less than or greater than these values, depending on the thicknesses of the materials used for the package substrate and lids.

The illustrated external package lid 42 includes the first aperture 2 therethrough. The first aperture 2 can be configured to allow ingress of audio signals from the outside environs 18 to an internal cavity 13 formed by the internal lid 40 (similar to the embodiments of FIGS. 1A-1D). The first aperture 2 can be formed by any suitable methods, such as by drilling, etching or the use of a laser. The first aperture 2 can have any of a variety of widths depending on many factors, including the size and sensitivity of the microphone die being used. In one implementation, the first aperture 2 has a width ranging between about 0.1 mm to about 1.0 mm, more particularly about 0.25 mm to about 0.6 mm. In some embodiments, the width of the first aperture 2 is about 0.5 mm. The first aperture 2 is shown as being offset from the internal lid 40; however, in other arrangements the first aperture 2 can be located in other positions, including positions on the sides of the external package lid 42, or on the package substrate 12 offset from the internal lid 40.

As shown in FIG. 2A, the illustrated internal lid 40 is attached to the package substrate 12 to define an internal housing around the internal cavity 13. As with FIGS. 1A-1D, an external cavity 15 can be formed between the internal housing and external housing, in this case between the internal lid 40 and the external lid 42. The internal lid 40 can be formed from, for example, metal or plastic or silicon with sufficient structural rigidity to support the chips or dies 19, 21 and wirebonding processes performed on them. As shown in FIG. 2A, the internal lid 40 can be three-dimensionally shaped to have a concavity that defines the internal cavity 13. The internal lid 40 can also be configured to provide RF shielding in a manner similar to that described above with reference to the external package lid 42. In addition, the internal lid 40 can be formed from any suitable material, including those disclosed above for the external lid 42.

The illustrated internal lid 40 is attached to the package substrate 12 using an internal lid adhesive 43 on the top or interior surface 28 of the package substrate 12. The internal lid adhesive 43 can comprise, for example, solder or a conductive or nonconductive epoxy. The internal lid adhesive 43 can be configured to create an acoustic seal to prevent the ingress or egress of audio signals from the internal cavity 13 to the external cavity 15. In one embodiment, the internal lid adhesive 43 is configured to provide electrical connectivity between the internal lid 40 and the package substrate 12 for grounding. In various embodiments, the internal lid 40 can have a height, $h_3$, defined by the distance from the top surface 28 of the package substrate 12 to a top surface 44 of the internal lid 40. In some implementations, $h_3$ can range from between about 0.05 mm to about 0.6 mm. In one embodiment, for example, $h_3$ can be about 0.2 mm. In other embodiments, $h_3$ can be less than or greater than these ranges depending on the desired height of the internal cavity 13, which can be designed, e.g., to enhance acoustic properties and/or debris capturing features of the device.

As with the internal housings of FIGS. 1A-1D, the internal lid 40 can comprise a second aperture 4, which can be a through hole with a width similar to that of the first aperture 2. Furthermore, an air way 14 can provide a path in which air can flow between the outside environs 18 and the internal cavity 13 through the first and second apertures 2, 4. The air way 14 can be defined by a channel 7 extending between the external package lid 42 and the internal package lid 40. As above, the channel 7 can comprise a tube that is fit within the first aperture 2 and that mechanically couples to the top surface 44 of the internal lid 40 as described above with respect to FIGS. 1A-1D. A seal 31 can be used as an interface between the channel 7 and the top surface 44 of the internal lid 40. The seal 31 can be an acoustic seal configured to substantially seal the channel 7 (e.g., tube) from the external cavity 15. The seal 31 can additionally serve as or further include an adhesive material to assist in coupling the channel 7 (e.g., tube) to the internal lid 40. The acoustic material can be in the form of an acoustic gel. In still other embodiments, the channel 7 (e.g., tube) can be press fit between both the first aperture 2 and the second aperture 4 to provide the air way 14 between the outside environs 18 and the internal cavity 13. In various other embodiments, the air way 14 can be formed through other locations on both the external lid 42 and the internal lid 40. For instance, the apertures 2, 4 can be formed on a side surface of the lids 40, 42, rather than through the top of the package, as shown in FIG. 1A.

One or more components can be mounted on the internal lid 40. For example, as shown in FIG. 2A, the integrated microphone die 19 can be a MEMS microphone die. The integrated MEMS microphone die 19 can be mounted to the top surface 44 of the internal lid 40 over a port hole 11 (e.g., a through hole acting as a sound port) using a microphone die adhesive 20. The microphone die adhesive 20 can be configured to acoustically seal the MEMS microphone die 19 over the port hole 11. Furthermore, the integrated circuit die 21 can be mounted to the top surface 44 of the internal lid 40, as shown, or mounted on the top surface 28 of the package substrate, using an integrated circuit die adhesive 22. In other embodiments, one or both of the MEMS microphone die 19 and the integrated circuit die 21 can also be mounted to the top surface 28 of the package substrate 12 (e.g., as in FIG. 1D) or to an interior surface of the external lid 42 (e.g., as in FIG. 1C). The microphone die adhesive 20 and the integrated circuit die adhesive 22 can be, for example, solder or an epoxy.

The microphone die adhesive 20 and the integrated circuit die adhesive 22 can be configured to electrically connect one or more portions of the MEMS microphones die 19 and integrated circuit die 21 to the internal lid 40 for grounding.

The integrated circuit die 21 can be used to process data from the MEMS microphone die 19, and can be an application specific integrated circuit (ASIC). In the embodiment illustrated in FIG. 2A, microphone die wire bonds 36 connect to the integrated circuit die 21, thereby allowing the integrated circuit die 21 to process electrical signals received from and/or sent to the MEMS microphone die 19. The integrated circuit die 21 can communicate with the package substrate 12 using integrated circuit die wire bonds 38. For example, the integrated circuit die wire bonds 38 can be configured to electrically connect the integrated circuit die 21 to traces (not shown in FIG. 2A) on the package substrate 12 that connect to leads (not shown) on the bottom of the package substrate 12, thereby permitting communication with external circuitry (e.g. a mobile phone device). Although the integrated circuit die 21 is illustrated as mounted on the internal lid 40 using the integrated circuit die adhesive 22, in certain implementations, the integrated circuit die 21 can be physically and electrically connected in other ways. For example, solder bumps or balls could be deposited onto chip pads on the top side of the integrated circuit die 21, and after flipping the die upside down and aligning the chip pads to matching pads on the package substrate 12, the solder could be flowed so at to interconnect the die and the package substrate. In yet other arrangements, through silicon via (TSV), anisotropic conductive film (ACF), or nonconductive paste (NCP) technologies can be employed.

With continuing reference to FIG. 2A, the illustrated MEMS microphone die 19 includes a die cavity 24, a movable membrane 27, and a backplate 25. During operation of the microphone, acoustic waves can reach a first side of the movable membrane 27, and the movable membrane 27 can be deflected by a pressure difference between the first, and a second, opposing side of the membrane. The backplate 25 can be fixed and can be separated from the movable membrane 27 by a gap, and therefore can serve in conjunction with the movable membrane 27 to form electrodes of a variable capacitor that can be configured to generate audio signals. For example, acoustic waves can cause the movable membrane 27 to vibrate relative to the fixed backplate 25, thereby producing a changing capacitance. The backplate 25 also includes backplate apertures 26. Furthermore, as discussed below, the package substrate 12 can also include a recessed region (not shown in FIG. 2A) in the top surface 28 of the package substrate 12. The recessed region can advantageously increase the volume of the internal cavity 13 in some embodiments to improve acoustic performance and/or prevention of contamination.

The MEMS microphone die 19 can be fabricated from a silicon or silicon-on-insulator (SOI) wafer, with a die thickness typical of integrated MEMS devices, e.g., about 300-400 µm. The backplate 25 can have a thickness suitable for integration within a MEMS device. The backplate 25 can be provided with the apertures 26 having a number, density, and size that permit air movement sufficient for microphone operation. Although reference has been made to certain dimensions for the components of the MEMS microphone die 19, persons of ordinary skill in the art will recognize that many other choices are appropriate.

As in FIGS. 1A-1D, the air way 14 can further extend through the port hole 11 to reach the microphone die 19. Thus, as shown in FIG. 2A, air (e.g., sound waves) can pass along the air way 14 through the channel 7, travel into the internal cavity 13 through the second aperture 4, and curve through the internal cavity 13. The air (sound waves) can then pass through the sound port 11 to communicate with the MEMS microphone die 19 mounted within the external cavity 15. As discussed above, the microphone die 19 can be positioned anywhere suitable within the external cavity 15, including as shown in FIGS. 1C-1D above. As discussed above, the relatively long air way 14 can reduce contamination of the die 19 by providing a longer path, and hence larger surface area, in which debris can accumulate before contacting the microphone die 19. Thus, as shown in FIG. 2A, the MEMS microphone die 19 is in fluid communication with the outside environs 18 and receives sound waves through the air way 14 for processing. However, by having a longer (and more indirect) air way 14 than typical top port packages, the amount of debris (e.g., particles/particulates) reaching the die 19 can be reduced. In some embodiments, the quality of the sound transmission can also be improved by the lengthened air way 14.

Figure 2B:
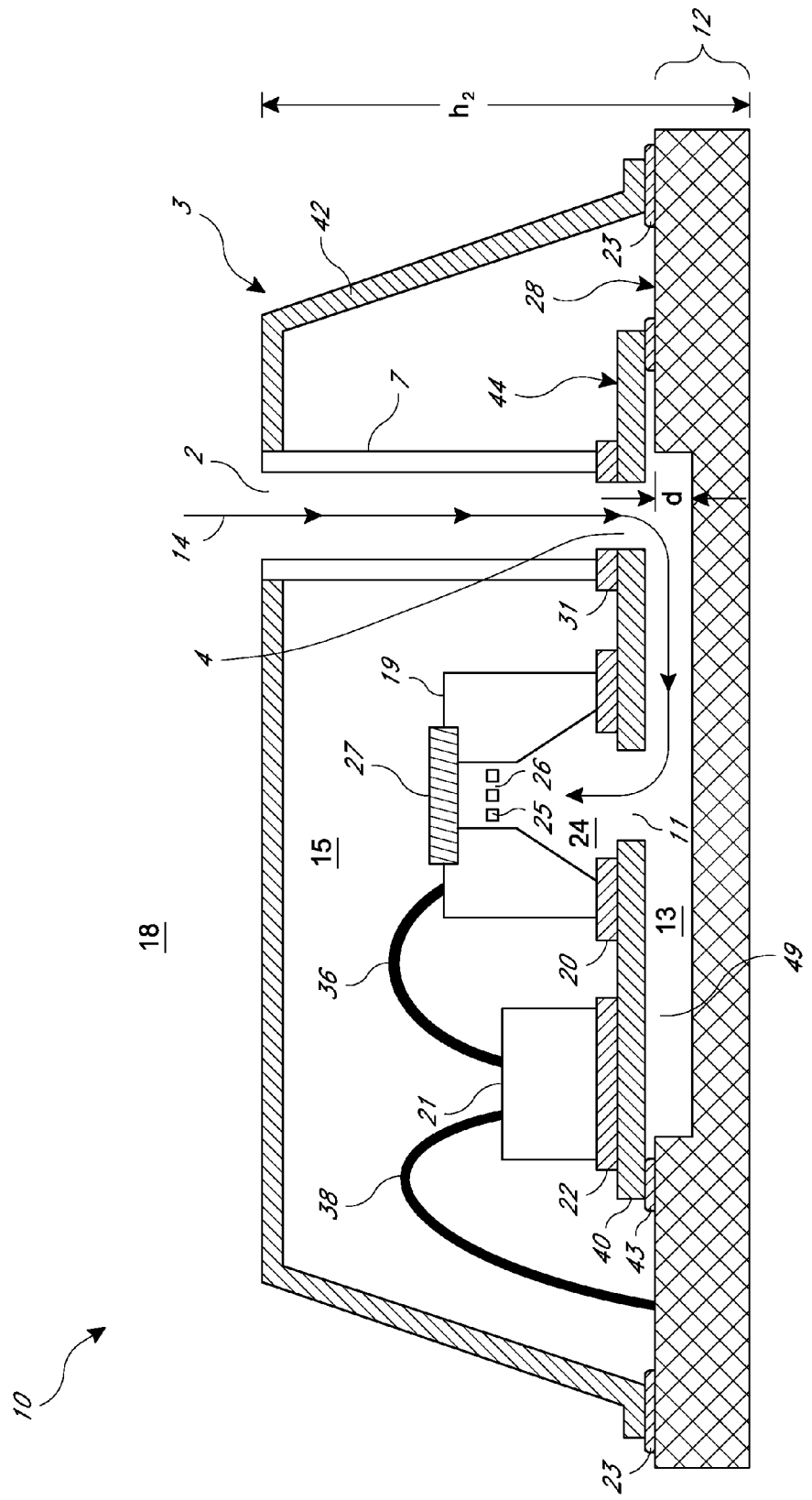
FIG. 2B is a schematic cross-sectional view of a packaged MEMS microphone device having an external lid and a substantially planar internal lid in accordance with one embodiment.

FIG. 2B illustrates another embodiment of a packaged integrated microphone device 10. The configuration of the packaged integrated microphone device 10 can generally be similar to that discussed above in connection with FIG. 2A. However, in FIG. 2B, the internal lid 40 is substantially planar. Moreover, the package substrate 12 includes a recessed region 49. The recessed region 49 can be formed, for example, by drilling or etching at least partially into the top surface 28 of the package substrate 12. In some embodiments, the recessed region 49 can have a depth d ranging from between about 0.05 mm and about 0.5 mm. The recessed region 49 can therefore partly define the internal cavity 13, and can beneficially improve acoustic performance and/or enhance contamination prevention in various embodiments.

The planar internal lid 40 can be mounted to an annular mounting structure coupled to the package substrate 12. An internal lid adhesive 43, as discussed above, can be used to mount the internal lid 40 to the top surface 28 of the package substrate 12. The embodiments illustrated in FIG. 2B can have additional advantages, including reducing the overall package height and increasing back volume. For instance, in FIG. 2B, the packaged integrated microphone device 10 can have a height $h_2$ defined between the bottom surface of the package surface 12 and the top or exterior surface of the external lid 42. In general, $h_2$ in FIG. 2B can be less than $h_1$ in FIG. 2A.

Figure 3:
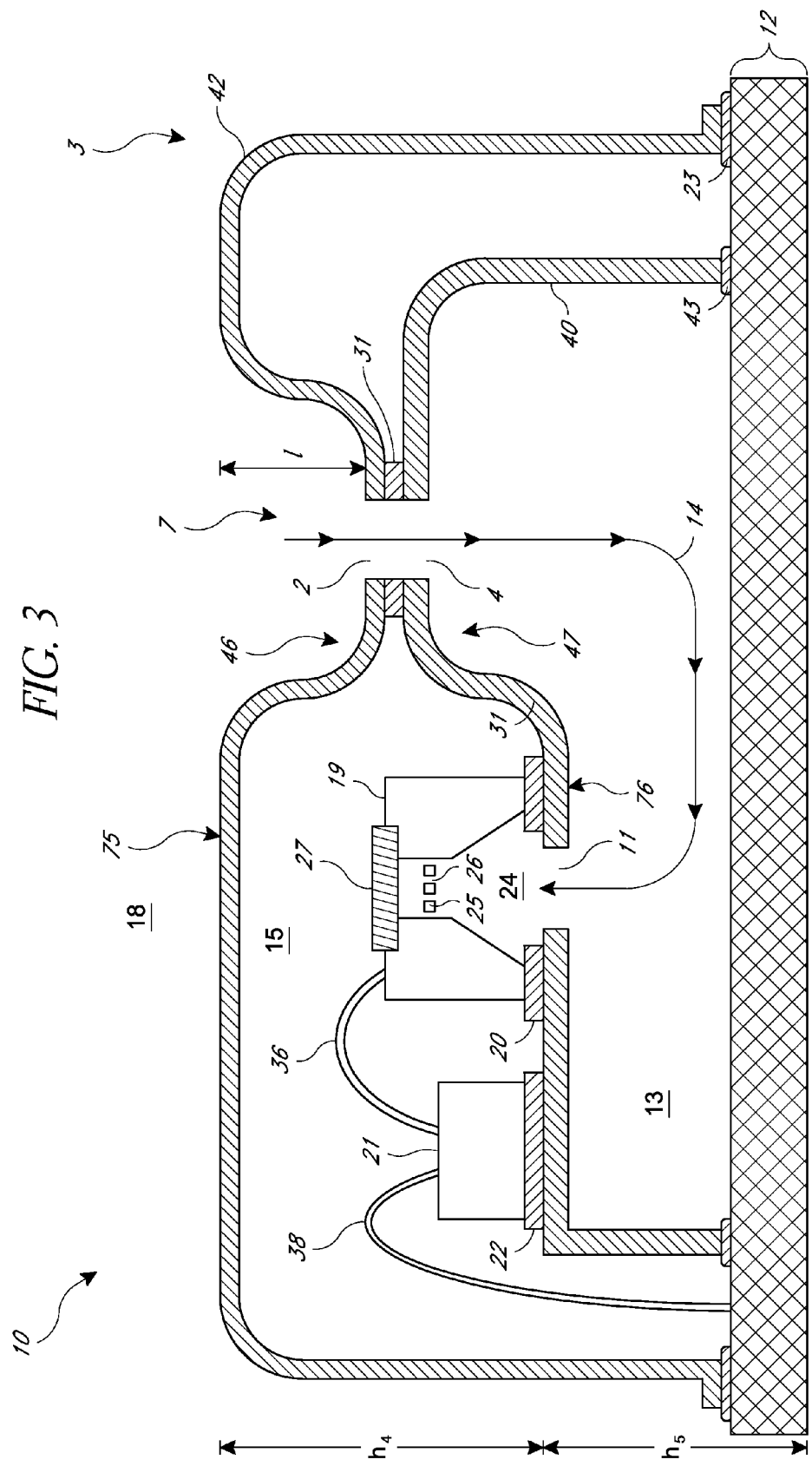
FIG. 3 is a schematic cross-sectional view of a packaged MEMS microphone device according to another embodiment.

Turning to FIG. 3, another embodiment of a packaged integrated microphone device 10 is disclosed. Many of the components in FIG. 3 are similar to those of FIGS. 2A-2B. For example, the illustrated packaged integrated microphone device 10 includes an external housing 3 comprising an external lid 42 coupled to a package substrate 12. An internal lid 40 is attached to the package substrate 12 to define an internal housing and form an internal cavity 13. An external cavity 15 can be formed between the internal lid 40 and the external lid 42. A microphone die 19 and an integrated circuit die 21 can be mounted within the external cavity 15, and the microphone die 19 can be positioned on the internal lid 40 over a port hole 11. As above, both the external lid 42 and the internal lid 40 are three-dimensionally shaped to form concavities.

Moreover, the external lid 42 can comprise a first aperture 2. The first aperture 2 can be defined by a first annular section 46 that surrounds an air way 14 that extends through both the external lid 42 and the internal lid 40. The internal lid 40 can include a corresponding second aperture 4 that is defined by a second annular section 47 that surrounds the air way 14. As shown in FIG. 3, the first annular section 46 can be bent inwardly, e.g., bent into the external lid's concavity. The second annular section 47 can be bent outwardly, e.g., bent out of or away from the internal lid's concavity. In other words, the first annular section 46 can be bent inwardly relative to an upper surface 75 of the external lid 42, while the second annular section 76 can be bent outwardly relative to a lower surface 76 of the internal lid 40. The first inwardly bent annular section 46 and the second outwardly bent annular section 47 can be formed in any suitable manner, including by punching, stamping, casting, molding, or any other material-forming methods. The distance l shown in FIG. 3 illustrates the approximate magnitude of the distances that the annular sections 46, 47 are bent. In some embodiments, the distance l can be between about 0.3 mm and 0.4 mm. Of course, the distance l can be less than or greater than this range in some implementations.

Unlike the embodiments of FIGS. 2A-2B, a channel 7 can be formed by contacting and/or mechanically coupling the first inwardly bent annular section 46 of the external lid 42 with the second outwardly bent annular section 47 of the internal lid 40. As with the embodiments of FIGS. 2A-2B, an acoustic seal 31 (e.g., annularly shaped) can be provided between the annular sections 46, 47. The seal 31 can provide substantially sealed fluid communication between the outside environs 18 and the internal cavity 13. Further, in some implementations, the first annular section 46 and the second annular section 47 can be mechanically coupled using the seal 31, which can serve as or include an additional material as an adhesive. In some implementations, the annular sections 46, 47 are first bent into the desired shape, and the apertures 2, 4 are punched or drilled (or otherwise formed) after assembly. In other implementations, the apertures 2, 4 are formed before the annular sections 46, 47 are bent.

The height of the packaged integrated microphone device 10 can be generally similar to the height disclosed above for FIGS. 2A-2B. In addition, the packaged integrated microphone device 10 of FIG. 3 can be characterized by a height $h_4$ that defines the distance between the external lid 42 and an upper surface of the internal lid 40, e.g., the space within which the integrated circuit die 21 and the microphone die 19 can be positioned. In some embodiments, the height $h_4$ can be between about 0.5 mm and about 0.9 mm. In one embodiment, $h_4$ can be about 0.8 mm. Furthermore, a height $h_5$ can define the distance between the upper surface of the internal lid 40 and the bottom surface of the package substrate 12. In some embodiments, $h_5$ can be between about 0.1 mm and about 0.4 mm. In one embodiment, $h_5$ can be about 0.2 mm.

As with the embodiments of FIGS. 2A-2B, the relatively long air way 14 can pass from the outside environs 18 through the channel 7 (e.g., through the first and second apertures 2, 4), into the internal cavity 13, and through the port hole 11 to fluidly communicate with the microphone die 19 and the external cavity 15. Advantageously, as discussed above, the lengthened air way 14 can reduce contamination reaching the die 19, and can improve the acoustic quality of the microphone in some implementations.

Figure 4A:
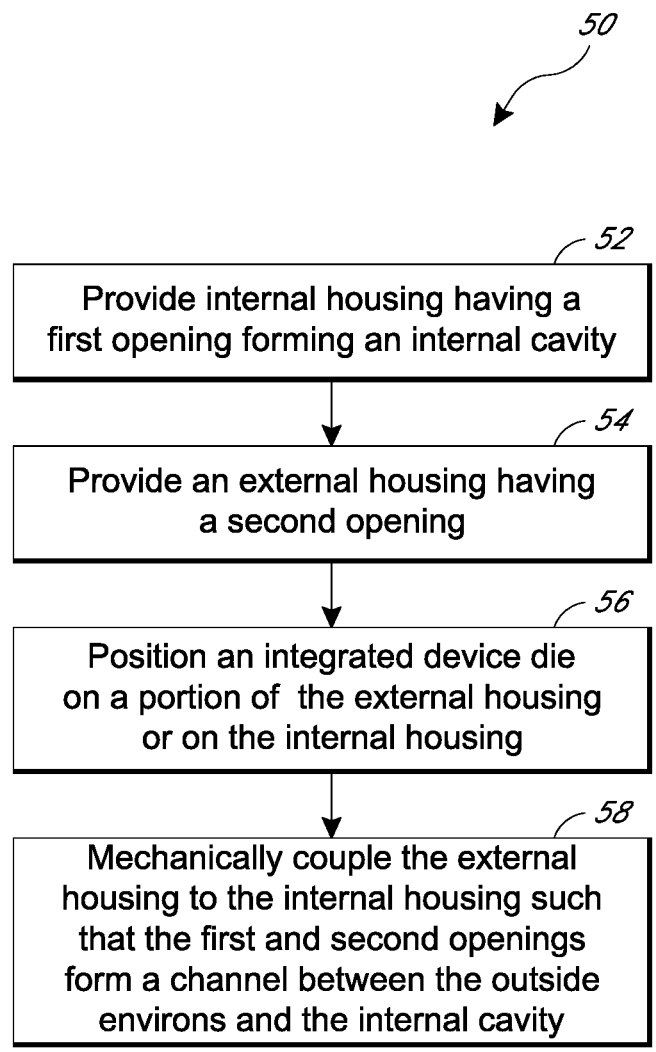
FIGS. 4A-4B illustrate flow charts for various embodiments of methods for packaging an integrated device die.

Turning to FIG. 4A, a method 50 for packaging an integrated device is illustrated. In Block 52, an internal housing having a first opening is provided. The internal housing can be shaped to enclose an internal cavity. In other embodiments, the internal housing can comprise a substantially planar lid. As discussed above, the internal housing can comprise an internal lid and a portion of a package substrate. In other embodiments, the internal housing can include a package substrate, package walls, and a lid mechanically coupled to the package walls.

In Block 54, an external housing having a second opening is provided. The external housing can be formed in any way that the internal housing can be formed. The internal housing is configured such that it can be positioned within the external housing to define an external cavity between them.

Turning to Block 56, an integrated device die is positioned on either a portion of the external housing or on the internal housing (e.g., as in any of the embodiments illustrated in FIGS. 1A-1D). As in FIGS. 2A, 2B, and 3, the integrated device die can be any suitable die. In some implementations, the integrated device die is a microphone device die, such as a MEMS microphone device die.

In Block 58, the external housing is mechanically coupled to the internal housing such that the first and second openings form a channel between the outside environs and the internal cavity. In some embodiments, the channel can be formed with a tube. In other embodiments, the channel can be formed by bending annular portions of the external and internal lids toward each other and mechanically coupling the annular portions together. Moreover, mechanically coupling the external housing to the internal housing can comprise mechanically coupling the internal lid to a package substrate and mechanically coupling an external lid to the package substrate.

Figure 4B:
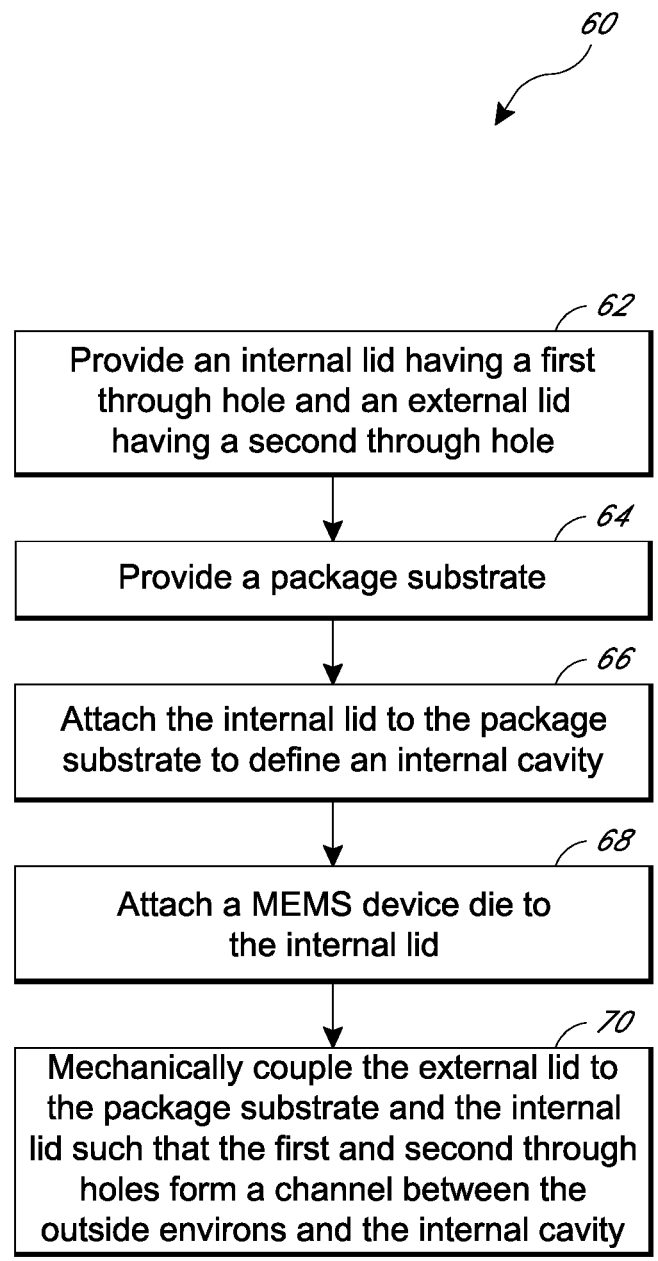

In FIG. 4B, a method 60 for packaging a MEMS device is disclosed. In Block 62, an internal lid having a first through hole is provided. In addition, an external lid having a second through hole is provided. The lids can be formed in any manner described above with respect to FIGS. 2A-2B, 3, and 4A.

In Block 64, a package substrate is provided. The package substrate can be formed from a variety of materials, including, for example, a ceramic package material or a printed circuit board (PCB) material, or pre-molded plastic with lead-frames. In various embodiments, the package substrate can include a recessed region formed within a portion of a top surface of the package substrate. Moreover, the package substrate can include one or more leads configured to electrically connect integrated device dies to external electrical/electronic devices.

Turning to Block 66, the internal lid is attached to the package substrate. The internal lid can be mounted on the top (or interior) surface of the package substrate using an adhesive material. Mounting the internal lid to the package substrate can define an internal cavity enclosed by the internal lid and the package substrate. In Block 68 a MEMS device die is attached to the internal lid. As discussed above, any suitable MEMS device die can be used, including, e.g., microphone device dies, pressure sensors, vibration sensors, capacitive sensors, piezoelectric sensors, and any other type of MEMS device. The MEMS device die can be positioned on an exterior surface of the internal lid and can be positioned over a port hole in some implementations.

In Block 70, the external lid is mechanically coupled to the package substrate and the internal lid such that the first and second through holes form a channel between the outside environs and the internal cavity formed by the internal lid. As discussed above, the channel can be formed in a variety of ways, including by providing a tube between external lid and the internal lid. In addition, the channel can be formed by contacting and/or coupling an inwardly bent annular section formed in the external lid with an outwardly bent annular section formed in the internal lid. In some embodiments, the channel is acoustically sealed from the external cavity that is defined between the external lid and the internal lid.

APPLICATIONS

Devices employing the above described schemes can be implemented into various electronic devices. Examples of the electronic devices can include, but are not limited to, consumer electronic products, parts of the consumer electronic products, electronic test equipment, etc. Examples of electronic products can include, but are not limited to, a mobile phone, a telephone, a computer, a hand-held computer, a personal digital assistant (PDA), an automobile, a multi functional peripheral device, medical devices (such as hearing aids), etc. Further, the electronic device can include unfinished products.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A packaged integrated device comprising:
an external housing;
an internal housing positioned within the external housing and defining an internal cavity, wherein an external cavity is defined between the external housing and the internal housing, wherein the internal housing comprises an internal lid attached to an interior surface of the external housing;
an integrated device die positioned within the external cavity in fluid communication with the internal cavity; and
an air channel formed between the outside of the packaged integrated device and the internal cavity.

2. The packaged integrated device of claim 1, wherein the integrated device die comprises a MEMS device die.

3. The packaged integrated device of claim 2, further comprising a port hole providing fluid communication between the internal cavity and the external cavity, wherein the port hole is in fluid communication with the channel.

4. The packaged integrated device of claim 3, wherein the channel is acoustically sealed from the external cavity.

5. The packaged integrated device of claim 3, wherein the integrated device die comprises a MEMS microphone die.

6. The packaged integrated device of claim 5, wherein the MEMS microphone die is mounted on the internal housing over the port hole.

7. The packaged integrated device of claim 6, further comprising an integrated circuit die mounted on the internal housing adjacent the MEMS microphone die and electrically connected to the MEMS microphone die and to the external housing.

8. The packaged integrated device of claim 6, further comprising an acoustic seal configured to substantially seal a joint between the channel and the internal housing.

9. The packaged integrated device of claim 2, wherein the external housing comprises a first through hole defined by a first annular section of the external housing, wherein the internal housing comprises a second through hole defined by a second annular section of the internal housing, wherein the first annular section is bent inwardly relative to an upper surface of the external housing, and wherein the second annular section is bent outwardly relative to a lower surface of the internal housing such that the first and second through holes align to define the channel.

10. The packaged integrated device of claim 9, further comprising an annular acoustic seal positioned between the first annular section and the second annular section and configured to acoustically seal the external cavity from the channel.

11. The packaged integrated device of claim 1, wherein the interior surface of the external housing comprises a portion of a package substrate, and wherein the internal lid is mounted on a surface of the package substrate using an adhesive.

12. The packaged integrated device of claim 11, wherein the internal lid is shaped to have a concavity that defines the internal cavity.

13. The packaged integrated device of claim 11, wherein the internal lid is substantially planar.

14. The packaged integrated device of claim 13, wherein the internal cavity is at least partly defined by a recessed region of the package substrate.

15. A packaged integrated device comprising:
an external housing;
an internal housing positioned within the external housing and defining an internal cavity, wherein an external cavity is defined between the external housing and the internal housing;
an integrated device die positioned within the external cavity in fluid communication with the internal cavity; and
an air channel formed between the outside of the packaged integrated device and the internal cavity,
wherein the channel comprises a tube extending between a first aperture in the external housing and a second aperture in the internal housing.

16. The packaged integrated device of claim 15, wherein the internal housing comprises an internal lid attached to an interior surface of the external housing.

17. A packaged integrated microphone device, comprising:
a package housing having a first through hole;
an internal lid mounted to an interior surface of the package housing to define an internal cavity, the internal lid having a second through hole and a sound port;
a channel extending through the package housing to the internal cavity and between the first through hole and the second through hole; and
a microphone die mounted inside the package housing, wherein the microphone die includes a movable membrane, and wherein the movable membrane is positioned to receive sound passing from outside the package housing through the channel, into the internal cavity, and through the sound port.

18. The packaged integrated microphone device of claim 17, wherein the package housing comprises a package substrate and an external lid, and wherein the internal lid is mounted to an interior surface of the package substrate.

19. The packaged integrated microphone device of claim 18, wherein the microphone die is mounted to the internal lid over the sound port.

20. The packaged integrated microphone device of claim 19, further comprising an integrated circuit die mounted within the package housing and electrically connected to the microphone die and to the package substrate.

21. The packaged integrated microphone device of claim 18, wherein the internal lid is shaped to have a concavity that defines the internal cavity.

22. The packaged integrated microphone device of claim 18, wherein the internal lid is substantially planar and the internal cavity is at least partly defined by a recessed region of the package substrate.

23. The packaged integrated device of claim 18, wherein the first through hole is defined by a first annular section of the external lid that surrounds the first through hole, wherein the second through hole is defined by a second annular section of the internal lid that surrounds the second through hole, wherein the first annular section is bent inwardly relative to an upper surface of the external lid, and wherein the second annular section is bent outwardly relative to a lower surface of the internal lid such that the first and second through holes align to define the channel.

24. The packaged integrated device of claim 23, further comprising an annular acoustic seal positioned between the first annular section and the second annular section.

25. The packaged integrated microphone device of claim 17, wherein the channel comprises a tube placed within the first through hole and extending between the first through hole and the second through hole.

26. A method for packaging an integrated device, the method comprising:
   providing an internal housing having a first opening, the internal housing defining an internal cavity and comprising an internal lid;
   providing an external housing having a second opening;
   positioning an integrated device die on the internal housing or on a portion of the external housing; and
   mechanically coupling the external housing to the internal housing such that the first and second openings form a channel between the outside of the external housing and the internal cavity, such that the internal housing is within the external housing, and such that the internal lid is attached to an interior surface of the external housing.

27. The method of claim 26, wherein providing the external housing comprises providing an external lid, wherein the second opening is formed through the external lid, wherein positioning the integrated device die comprises positioning a microelectromechanical systems (MEMS) die on the internal housing or on the external lid, and wherein mechanically coupling the external housing to the internal housing comprises mechanically coupling the internal housing to a package substrate and mechanically coupling the external lid to the package substrate.

28. The method of claim 27, further comprising positioning an integrated circuit die on the package substrate or on the internal housing and electrically connecting the integrated circuit die to the MEMS die and to the package substrate.

29. The method of claim 26, wherein mechanically coupling the external housing to the internal housing comprises positioning a tube between the first and second openings to form the channel.

30. The method of claim 26, the external housing further comprising a first annular section surrounding the first opening and bent inwardly relative to an upper surface of the external housing, the internal housing further comprising a second annular section surrounding the second opening and bent outwardly relative to a lower surface of the internal housing, and wherein mechanically coupling the external housing to the internal housing comprises contacting the first inwardly bent annular section with the second outwardly bent annular section to form the channel.

\* \* \* \* \*